(12) United States Patent
Schneider

(10) Patent No.: US 7,764,201 B2
(45) Date of Patent: Jul. 27, 2010

(54) TABLE MANAGEMENT FOR LZW WITH FIXED-SIZE TABLES

(75) Inventor: James P. Schneider, Raleigh, NC (US)

(73) Assignee: Red Hat, Inc., Raleigh, NC (US)

( * ) Notice: Subject to any disclaimer, the term of this patent is extended or adjusted under 35 U.S.C. 154(b) by 49 days.

(21) Appl. No.: 12/324,684

(22) Filed: Nov. 26, 2008

(65) Prior Publication Data

US 2010/0127900 A1    May 27, 2010

(51) Int. Cl.
*H03M 7/34* (2006.01)

(52) U.S. Cl. .......................... 341/51; 341/106

(58) Field of Classification Search .................. 341/51, 341/106

See application file for complete search history.

(56) References Cited

U.S. PATENT DOCUMENTS 5,951,623 A * 9/1999 Reynar et al. ............... 708/203
6,657,564 B2 * 12/2003 Malik .......................... 341/51

* cited by examiner

*Primary Examiner*—Khai M Nguyen
(74) *Attorney, Agent, or Firm*—Blakely, Sokoloff, Taylor & Zafman LLP

(57) ABSTRACT

Managing a string translation table, where a compressor includes information in the table entries to distinguish strings as more or less important. More particularly, the compressor can identify a string in an input stream, determine an age indicator for the string, and record the age indicator in the table. When the string is encountered or identified, a use indicator or counter may be adjusted to indicate use of the entry and timing information related to encountering the entry. Instead of discarding all entries in the string translation table, a portion of the table can be discarded that has less important entries. The determination of whether to discard an entry as being less important can be based on the age indicator and the use indicator.

19 Claims, 5 Drawing Sheets

FIRST INSTANCE 320

ENTRY CREATION 330

SUBSEQUENT INSTANCE 340

ENTRY UPDATE 350

TABLE MANAGEMENT FOR LZW WITH FIXED-SIZE TABLES

FIELD

The invention is generally related to implementation of compression, and particular embodiments relate to table management in a system having fixed-size string translation tables for use in compression.

COPYRIGHT NOTICE/PERMISSION

At least a portion of the disclosure of this patent document contains material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2008, Red Hat, Inc., All Rights Reserved.

BACKGROUND

As the amounts of data used increases, the amount of storage space for storage of data, and the amount of bandwidth for transfer of data also increase. Compression is commonly used to reduce requirements for storage and/or transfer bandwidth. For compression of text, the use of the Lempel-Ziv-Welch (LZW) algorithm is very common. LZW traditionally works by generating a fixed-size string translation table that maps codes to strings. The algorithm is assumed to be understood, and will not be described in detail herein.

LZW traditionally constructs the string translation table, or a table of strings, from strings that have been encountered or read in the input data stream. The compressor outputs an index, being the fixed-size code, for certain characters. The indexes are output using only as many bits as would be required (for example, if there are 500 strings in the table, the indexes would only use 9 bits each). Unfortunately, LZW has a maximum table size, and once the maximum number of entries has been used in the table, the entire contents of the table are discarded. The compressor then starts over with loading the table with encountered strings.

Especially for large input streams, the discarding of the string translation table may be inefficient. The table may include a number of strings that have occurred multiple times in the input stream, and may again occur many times through the remainder of the input stream. However, current LZW implementations have no way to distinguish one entry from another, and all entries are discarded, regardless of potential importance.

BRIEF DESCRIPTION OF THE DRAWINGS

The following description includes discussion of figures having illustrations given by way of example of implementations of embodiments of the invention. The drawings should be understood by way of example, and not by way of limitation.

DETAILED DESCRIPTION

Figure 1:
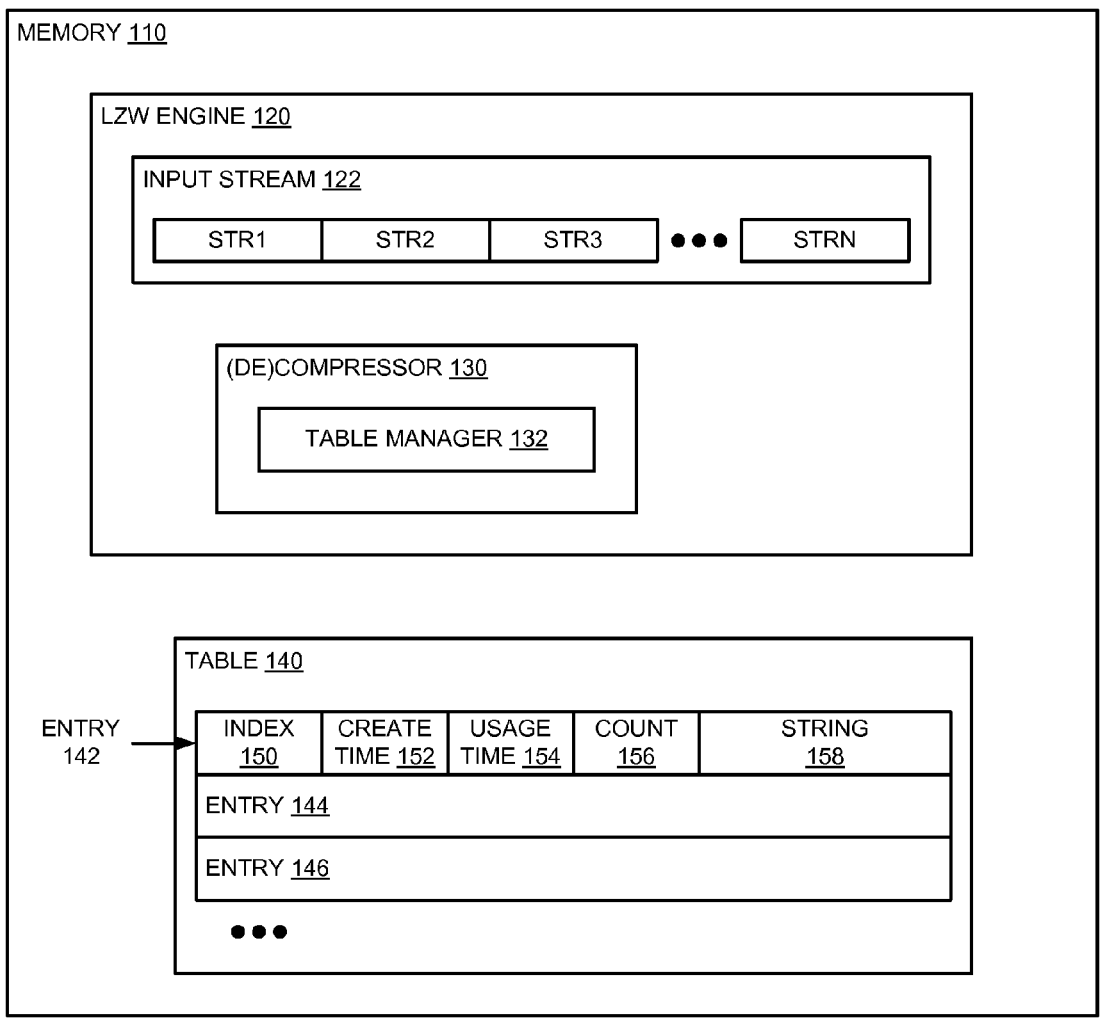
FIG. 1 is a block diagram of an embodiment of a system having table management to implement a string translation table with indicators of "importance" of particular table entries.

A string translation table for a compression algorithm can be augmented with information that indicates the importance of an entry in the table. The importance information can then be used to determine what entry or entries will be discarded from the table, either at strategic points (e.g., a threshold number of entries in the table to prevent filling the table up completely), or when the table is full and a new entry is to be added. A compressor can identify a string in an input stream, and record age information for the identified string. The age information is one element of importance information. Another importance indicator may be a use count, which indicates a number of times the string has been used (or how many time the entry has been used as an index in the resulting compression). The importance information is considered when determining to discard one or more entries from the string translation table. Instead of discarding all entries in the string translation table as with traditional LZW, entries can be discarded one by one, or in portions.

In the following description, numerous details are set forth. It will be apparent, however, to one skilled in the art, that the present invention may be practiced without these specific details. In some instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "sending", "receiving", "comparing", "hashing", "maintaining", or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct more a specialized apparatus to perform the required operations of the method. Structure for a variety of these systems will appear as set forth in the description below. In addition, the present invention is not described with reference to any particular programming language. It will be appreciated that a variety of programming languages may be used to implement the teachings of the invention as described herein.

As used herein, referring to "importance" factors could be understood as a heuristic. What may be important as relates to an entry in a string translation table may not necessarily be considered so important in other areas. However, referring to importance factors is useful in describing how to determine how entries will be chosen for removal from the string translation table. It is also useful to think of important entries remaining in the table, while the least important entry or entries are removed.

In one embodiment, an age indicator is used as an importance factor. The age indicator could be implemented as a byte offset from a starting point of processing of an input stream. Thus, the byte offset would simply be a number or value that increases as more of the input stream is processed. It will be understood that a byte offset refers to a byte address relative to a starting point. The starting point may be the beginning of the input stream. In one embodiment, significant portions of the table can be discarded, and the offset could be relative to the time the portions were discarded. In such an implementation, remaining entries may need to have their creation entries reset, which would result in a processing overhead/burden. The "age" of a particular string can then be compared against the "age" of another string encountered at a different place in the input stream. Assuming that newer strings are preferred over older strings (as being considered more "hot" in the sense of a string compression), the "older" strings will have lower age indicators than the newer strings. An alternative to using a byte offset would be to have a counter that runs, whose value could be used for the age indicator.

When an entry is created, the byte offset is copied into the entry as its creation time. When an entry is used as an index, the offset is copied to the entry as its last use time, and a usage count is incremented. When the table gets filled up, and an entry needs to be discarded, the entries are sorted according to a weighting factor computed by multiplying each entry's usage count by its most recent use value, and adding the creation value. These values would be sorted, and the lowest numerical value would be the entry that would be removed from the table.

In addition to the age indicator or age indicators (as discussed in more detail below), the string translation table can be augmented with a use indicator or use count. The use count indicates how many times the particular entry has been used. The value stored in the use count can be a number starting at zero or one (or some other chosen initial value) and incremented based on use. One simple alternative to an intuitive approach of initializing an entry to zero or one and incrementing by one would be to initialize the use count to zero or two, and increment by twos (making the math simple binary arithmetic). It will be understood that other initial values could be used, and incrementing could refer to any increment applicable to a particular implementation.

With regards to discarding or removing entries from the string translation table, the discarding of an entry is based on the importance of the entry, as indicated by the age indicators. When the table gets filled, the least "important" entries from the table get discarded to make room for a new entry. As mentioned above, discarding entries can be based on performed when the table is full, or at some threshold level of the table. The determination of when to remove one or more entries can be configurable for each implementation. In one embodiment, rather than discarding entries one at a time, or discarding all entries (as with traditional LZW implementations), the entries can be discarded as a portion of the table. For example, when a table becomes full, the compressor can discard one-half, or three-quarters of the entries in the table. It will be understood that while the compressor is referred to, a similar table is used, and could be used with similar techniques described herein, for a decompressor.

When removing multiple entries in the string translation table, determining what are the "least important" half of entries to remove could be aided by sorting the table. In one embodiment, the table is sorted in order of "importance" of entry in conjunction with discarding the entries. In another embodiment, the compressor maintains a list of entries in the string translation table in a sorted order to make removal of the entries simpler. For example, the "importance" computation based on age indicator(s) and use count can be performed every time an entry is modified (e.g., through finding an occurrence of the corresponding string in the input stream), or when an entry is created. In an alternate embodiment, instead of sorting a list representing the entries in the table, the compressor could include pointers to the table entries, and maintain the table as a linked list.

FIG. 1 is a block diagram of an embodiment of a system having table management to implement a string translation table with indicators of "importance" of particular table entries. System 100 represents a system, such as a personal computer, gaming system, or other computing system that implements compression based on a string translation table. In one embodiment, the compression is based on or compatible with the LZW (Lempel-Ziv-Welch) compression algorithm, which is known to those skilled in the art. System 100 includes memory 110, which represents an operational memory from which the algorithm will be executed. Memory 110 is commonly volatile memory that loses its value if power is interrupted, but may also be non-volatile memory such as flash memory. Memory 110 generally represents the memory that holds the instructions from which a processor in system 100 will execute.

Memory 110 includes LZW engine 120 and table 140. LZW engine 120 represents an example of a compression or decompression implementation that uses string translation tables. Table 140 represents one or more tables employed by LZW engine 120 to store entries for use in the translation (and thus compression or decompression) from strings to codes.

Input stream 122 represents a stream of characters that is processed by LZW engine 120. The processing of the input stream results in the compression. Input stream 122 may be, for example, a stream of text. The "stream" refers to the fact that the data in the stream typically is thought of as having an order to produce the same data in the compressed form. From the perspective of the LZW engine, input stream 122 can be thought of as a sequence of strings, string 1 (STR1) through string N (STRN). One or more of the strings between string 1 through string n may be repeated any number of times.

LZW engine 120 is shown including (de)compressor 130. It will be understood that the mechanisms described herein could apply equally well to compression or decompression. Thus, for purposes of simplicity in description, only compression will be discussed. Compressor 130 represents modules or components that implement the compression of input stream 122. Compressor 130 includes table manager 132, which represents the components that enable compressor 130 to manage a string translation table in accordance with importance factors as described herein.

Table 140 includes entries 142, 144, 146, . . . , which represent various entries that may be included within a string translation table. Each entry corresponds to a string in input stream 122. Thus, each entry 142, 144, 146, . . . , corresponds to a string STR1 through STRN, and any other string that may be present within the input stream. The first entry shown, entry 142, is illustrated with one embodiment of fields that may be included in each entry. For example, string 158 is the corresponding string that would be encountered in the input stream. It will be understood that the fields in the entries may be in a different order than what is shown.

Index 150 represents a code that may be used to compress corresponding string 158. For example, for purposes of illustration, consider that string 2 corresponds to string 158 of entry 142. Thus, when compressor 130 encounters string 2 in input stream 122, it will replace the string with the code of index 150 in a compressed file representing input stream 122. As mentioned previously, index 150 will generally include a number of bits corresponding to the number of bits necessary to represent the number of strings (entries) the table can hold. Such a number is generally part of a configuration of the table or configuration of LZW engine 120.

Create time 152 represents a time of creation of entry 142. Create time 152 may also be referred to as a creation age indicator, referring to an age indicator that indicates when the entry was generated in table 140. As discussed above, create time 142 may include a value representing a byte offset from a starting point in input stream 122. For example, perhaps string 1 is the first string in input stream 142. The byte offset of string 1 would be zero, while the byte offset of string 2 would be the number of bytes in string 1. The byte offset of string 3 would be the value of the number of bytes in strings 1 and 2, and so forth. Alternatively, a timer or counter could be included in memory 110, or within LZW engine 120 itself to determine an age of a string. The value of the timer could be stored in the create time field.

Similar to create time 152 is the field usage time 154. Usage time 154 indicates a time when string 158 was last encountered in input stream 122. An more detailed example is provided below with reference to FIG. 3. In one embodiment, usage time 154 is optional. The "aging" process of entries is different when usage time 154 is not used. An advantage to using usage time 154 is to allow multiple indicators (both original creation time, as well as last usage time) to determine how important a string is. The general assumption is that older strings are likely to be less important, unless used frequently, in which case count 156 will adjust for the older creation time, as described more below. An advantage to not using usage time 154 is to have reduce the number of entries in table 140. In such an implementation where usage time 154 is not included, create time 152 may simply be overwritten if the string is encountered again. Otherwise, create time 152 may be written once, and usage time 154 will be overwritten as the string is encountered in the input string of characters. Thus, whether using only create time 152, or using both create time 152 and usage time 154, each entry may have an age indicator that is replaced as the string is again encountered in the input stream.

Count 156 refers to the count or counter that can be kept to indicate the number of times a string is encountered in input stream 122. Create time 152, and potentially usage time 154, and count 156 are used to compute a value that is used to determine whether entry 142 should be removed from table 140. In one embodiment, determining whether to remove the entry includes computing or calculating a value based on the values of create time 152, usage time 154, and count 156. For example, usage time 154 and count 156 may be multiplied together, and then added to the value of create time 152. Thus, entry 142 will be "aged" based on the create time, but the entry will quickly have a relatively higher value indicating greater importance if the string is encountered multiple times.

Figure 2:
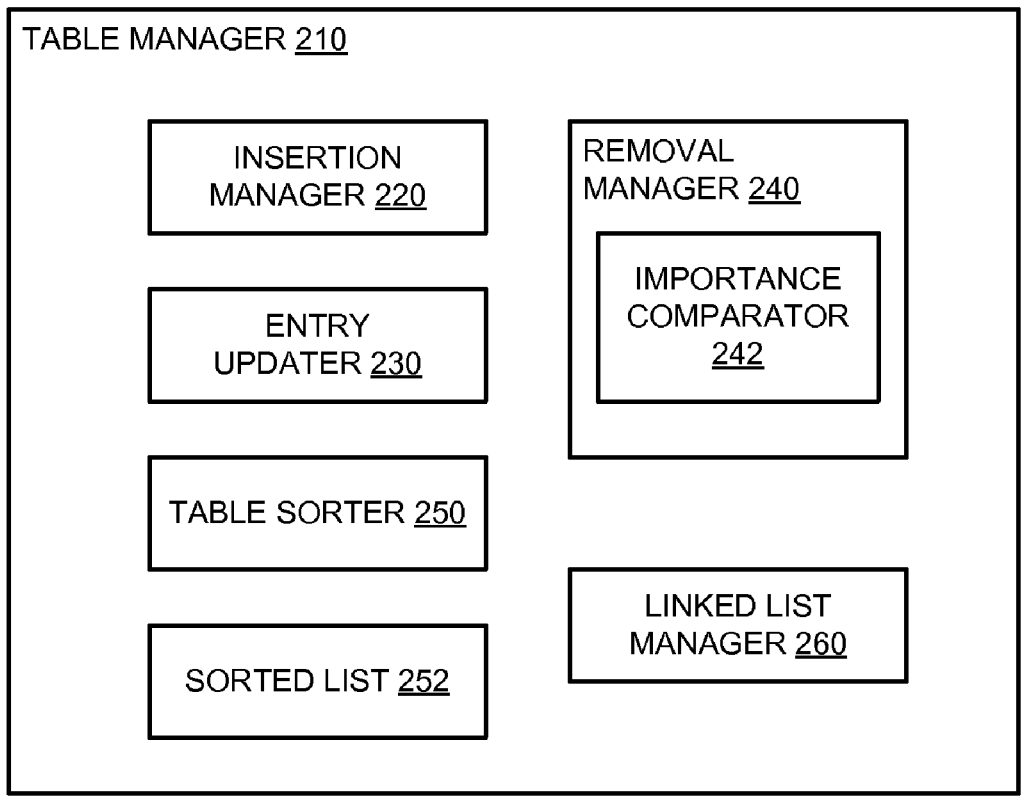
FIG. 2 is a block diagram of an embodiment of a table manager.

FIG. 2 is a block diagram of an embodiment of a table manager. Table manager 210 is an example of a table manager according to any embodiment described herein, for example, table manager 132 of FIG. 1. Table manager 210 is illustrated with various functional components, which does not necessarily represent an exclusive or necessary set of components. In certain implementations, table manager 210 may include more or fewer components than what are illustrated.

Insertion manager 220 enables table manager 210 to create new entries in a string translation table. New entries are added as new strings are encountered in an input stream, as is understood in the art. Included within insertion manager 220 is logic necessary to create additional fields within the entries of the table as compared to the entries as known in the art. Such fields are described herein as age indicators and use counts. Insertion manager 220 reads a time indicator (e.g., computes a byte offset of the string) to insert into the entry as a creation time.

Entry updater 230 enables table manager 210 to update the entries in the string translation table. When a string is encountered in an input stream in conventional LZW, the entry is simply used as an index. Typically nothing is done with the entry other than reading the code value to apply to the compression file generated through the processing of the input stream. Thus, traditionally, table entries were created and then accessed if the same string was encountered, but were not modified. In contrast, table manager 210, through an entry updating mechanism, updates the entries in the table when the strings are encountered in the input stream. For example, an age indicator may be updated to reflect the new time indicator where the string was again encountered. A use count may be updated to reflect the number of times a string is encountered. Hot strings are thus more likely to stay in the table, because their updated age indicators and use counts will increase more rapidly than cold strings.

Removal manager 240 enables table manager 210 to remove entries in the string translation table based on importance of the string. Removal manager 240 includes importance comparator 242 to compare the relative importance of one string to another to determine which strings are important enough to keep in the table. In one embodiment, removal manager 240 removes one entry (the least important, as determined by calculation based on the age indicators and use counts) to provide room to insert another entry into the table. In one embodiment, removal manager 240 removes a number of entries if the table becomes full (e.g., one quarter, or one half, or some threshold number of the entries from the table). In one embodiment, if the table becomes full, removal manager 240 removes all entries having an importance value less than a certain level, or having a use count lower than a certain threshold. If a sorted list of the entries in the table were kept, the determination of the threshold could be made by simply starting at the top of the table and traversing down until an entry is found that has an importance value lower than the threshold. In that case, all entries below that entry could be removed.

Table sorter 250 enables table manager 210 to keep a sorted list of the entries in the string translation table. It will be understood that the entries in the string translation table are generally stored in a tree organization, making it so that organizing the actual table in sorted order would likely disrupt the operation of the compressor. Thus, ordering of the table entries may be performed as an additional operation to the ordering of the entries in the table itself The ordering of the table entries based on importance factors would be kept separately by the table manager, and used as needed to remove entries. In one embodiment, table sorter 250 maintains a list of all entries in sorted order, as illustrated by sorted list 252.

Alternatively to a sorted list, table manager 210 may include linked list manager 260, which can provide pointer information in each entry (which may then include creating additional fields in the entries of the string translation table). The creation and management of linked lists are known, and will not be described in detail here. Briefly, one entry would point to two other entries—one is logically "before" the entry in order, and the other is logically "after" the entry in the order. Inserting and removing an entry from the linked list would be based on importance of the entry. The removal mechanisms will be understood to work in similar ways for linked lists as for a sorted list. The linked list could be traversed similarly to how a sorted list may be traversed down or up.

Figure 3:
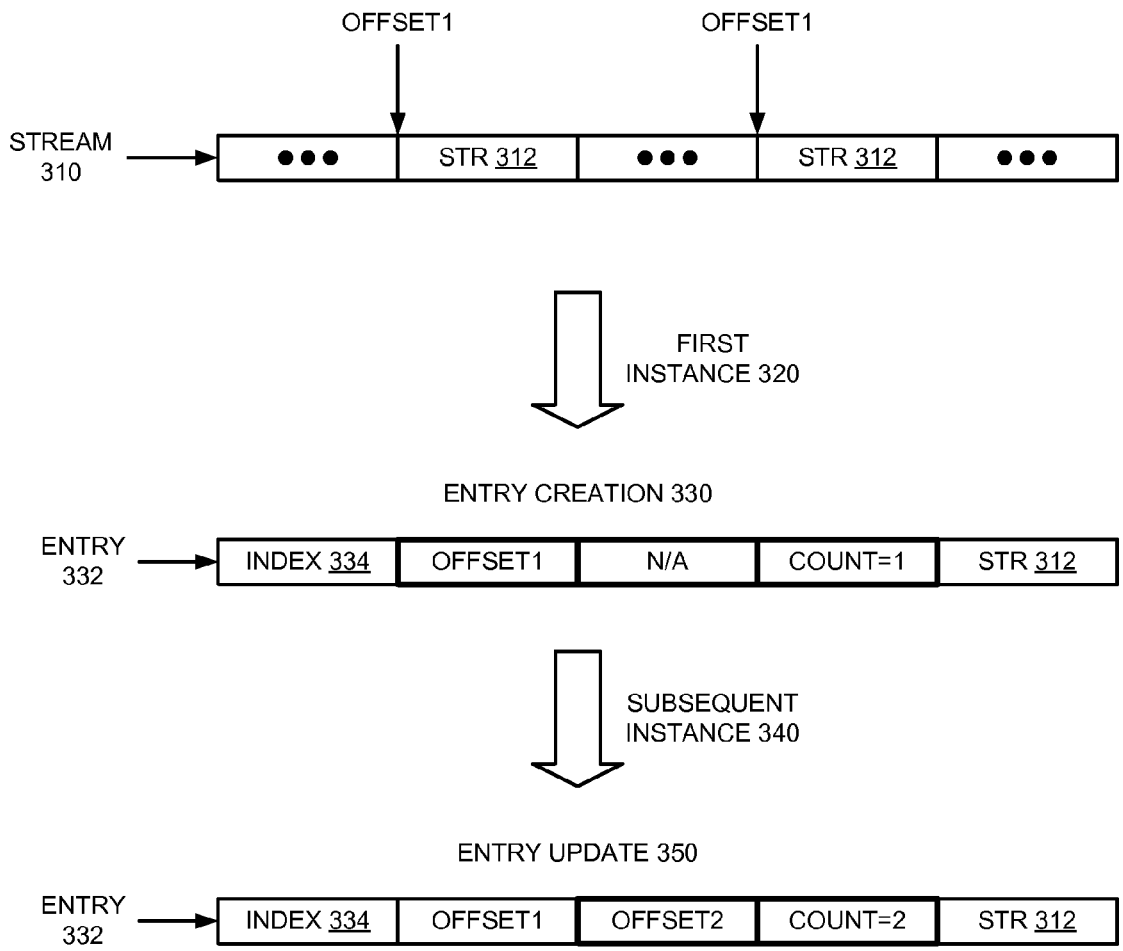
FIG. 3 illustrates an embodiment of a modification to fields of an entry in a table based on use of the data of the entry.

FIG. 3 illustrates an embodiment of a modification to fields of an entry in a table based on use of the data of the entry. Stream 310 illustrates an input stream with a sequence of characters that can be organized as strings. Somewhere within stream 310 is a first instance of string 312. The first instance of string 312 occurs at Offset1. Offset1 is understood as an example of an age indicator or a relative time in stream 310 where the string is encountered.

Encountering the string for the first time (first instance 320) causes entry creation 330. Entry creation 330 includes the creation of entry 332, which has index 334 corresponding to string 312. Entry creation 330 also includes the creation of fields to hold importance parameters, including the creation time, time of last usage, and number of times used. Such fields are illustrated with their values of Offset1, not applicable, and 1, respectively. In place of the not applicable, a default value may be stored in the time of last usage. In one embodiment, Offset1 would be copied both into the creation time and time of last usage fields.

Each subsequent instance of string 312 encountered (subsequent instance 340) causes entry update 350. Entry update 350 updates entry 332. The entry, the index (334), and the corresponding or associated string (312) are the same, as is the creation time. However, the time of last usage and the count are updated to Offset2 (or other value for subsequent uses) and 2 (or other number for subsequent uses), respectively, reflective of the age indicator and count for the second occurrence. Similar updates occur with subsequent reads of the string in the stream.

Figure 4:
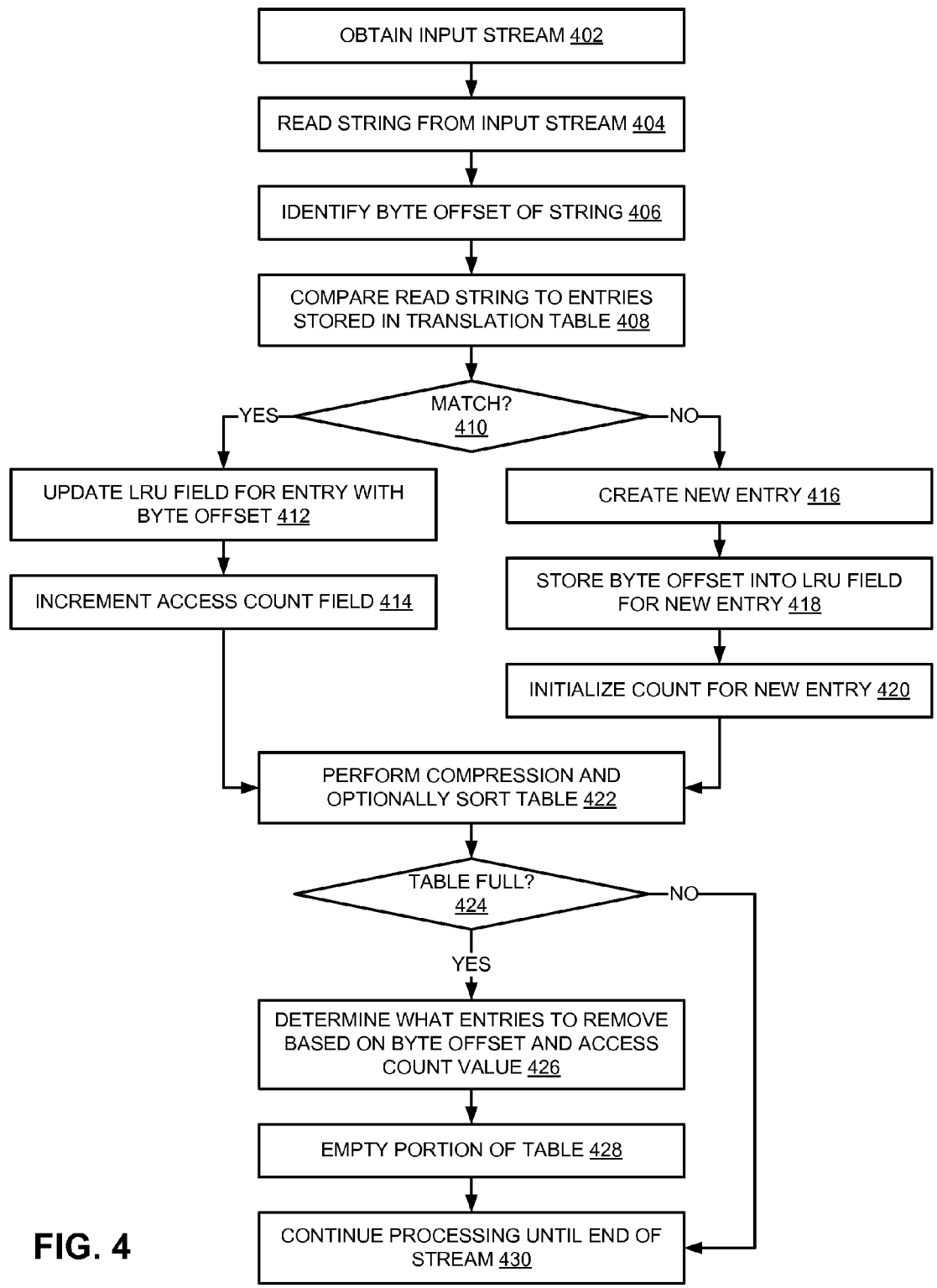
FIG. 4 is a flow diagram of an embodiment of a method for managing a string translation table with indicators of importance of particular table entries.

FIG. 4 is a flow diagram of an embodiment of a method for managing a string translation table with indicators of hotness of particular table entries. The method or process may be performed by processing logic that may include hardware (e.g., circuitry, programmable logic, microcode, etc.), software (such as instructions run on a processing device), or a combination thereof. For convenience, reference is made to components that might perform one or more of the operations described below. Reference to particular components may not necessarily be exclusive, and other components not specifically called out may perform one or more of the following operations.

A compressor of a compression algorithm (e.g., 130) obtains an input stream (e.g., 122) for processing, 402. The compressor reads a string (e.g., 312, a sequence of characters from the input stream) from the stream, 404. In one embodiment, a table manager (e.g., 132) of the compressor identifies or determines a byte offset of the string, 406. The compressor compares the read string to entries already stored in a string translation table, 408.

If the string matches an entry already stored in the table, 410, the table manager updates a least recently used (LRU) field in the entry with the byte offset of the string, 412. The LRU field can be understood as a time of last use, or also as a use age indicator. The table manager also increments an access count or use count field of the entry, 414.

If the string does not match an entry already in the string translation table, 410, the table manager creates a new entry for the string, 416. The table manager stores the byte offset into an LRU field in the new entry, 418. In this case, the LRU field may be a creation age indicator field, or a time of creation of the entry. The table manager also initializes the count field of the new entry, 420.

If either the entry is created new or an existing or previous entry is updated, the compressor performs the compression on the string, 422. Optionally, the compressor via the table manager sorts the table, as is described above, 422. In one embodiment, no entries are removed from the table until the table reaches its maximum number of entries. The maximum number of entries may be set by allocation (e.g., an amount of memory), or by designation of what a "maximum number" is, or a designation of a threshold number of entries after which entries must be removed from the table. In such an implementation, if the table is not full, 424, the compressor can continue processing until the end of the input stream, 430, adding new entries and updating existing entries as appropriate.

If the table is full, 424, the table manager may determine what entry or entries to remove based on the byte offset, and access count or use count value of the entry, 426. The table manager removes or empties a portion of the table based on the determination based on "importance" factors, 428. The compressor continues processing until the end of the input stream, 430, adding new entries and updating existing entries as appropriate.

Figure 5:
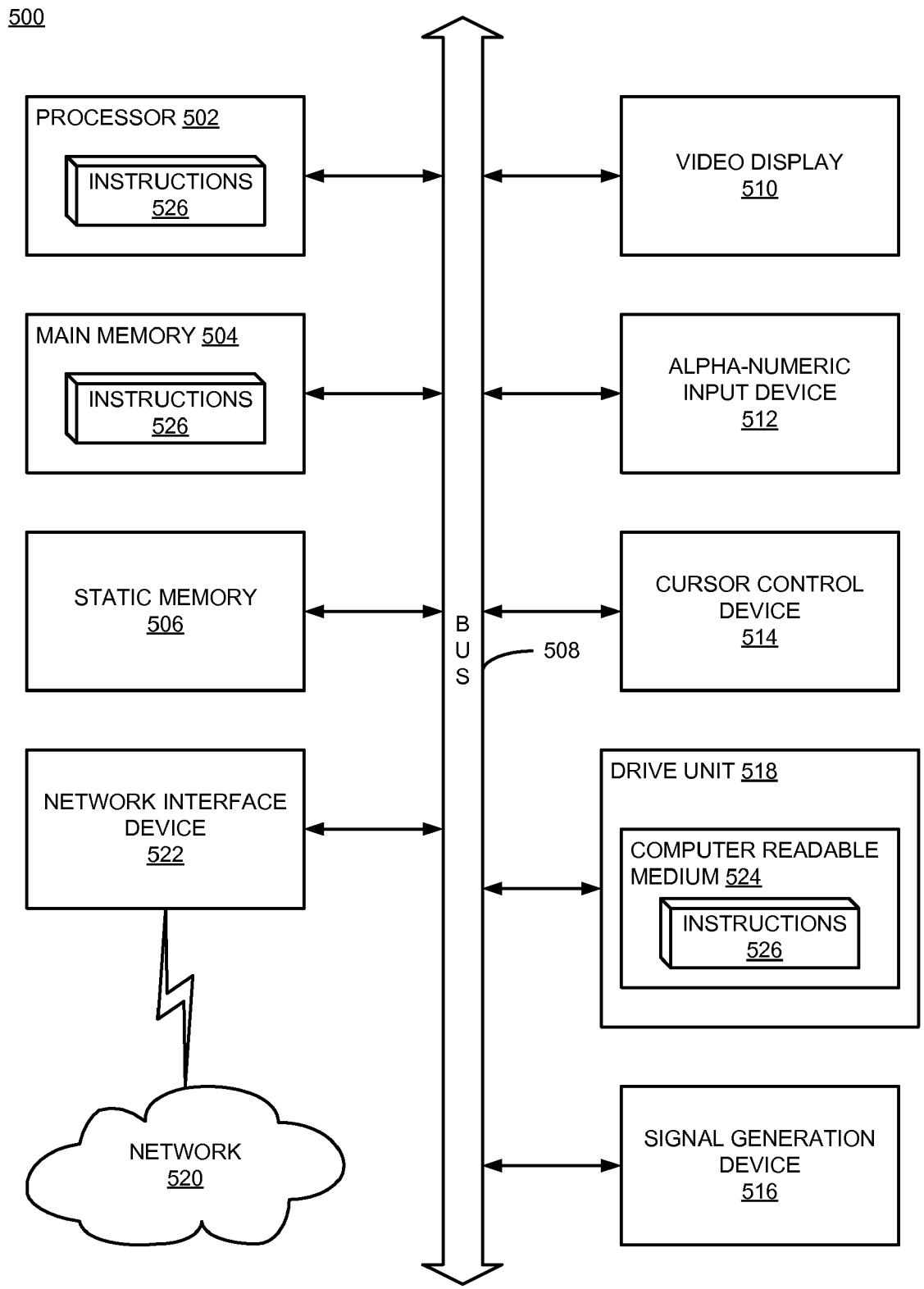
FIG. 5 is a block diagram of a computing device on which embodiments of the invention may be implemented.

FIG. 5 illustrates a diagrammatic representation of a machine in the exemplary form of a computer system 500 within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 500 includes a processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 508.

Processor 502 represents one or more general-purpose processing devices such as a microprocessor, central processing unit, or the like. More particularly, the processor 502 may be a complex instruction set computing (CISC) microprocessor, reduced instruction set computing (RISC) microprocessor, very long instruction word (VLIW) microprocessor, a processor implementing other instruction sets, or processors implementing a combination of instruction sets. Processor 502 may also be one or more special-purpose processing devices such as an application specific integrated circuit (ASIC), a field programmable gate array (FPGA), a digital signal processor (DSP), network processor, or the like. Processor 502 is configured to execute the processing logic 522 for performing the operations and steps discussed herein.

The computer system 500 may further include a network interface device 526. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-readable storage medium (or more specifically a computer-readable storage medium) 524 on which is stored one or more sets of instructions (e.g., software 522) embodying any one or more of the methodologies or functions described herein. The software 522 may also reside, completely or at least partially, within the main memory 504 and/or within the processing device 502 during execution thereof by the computer system 500, the main memory 504 and the processing device 502 also constituting machine-readable storage media. The software 522 may further be transmitted or received over a network 520 via the network interface device 526.

While the machine-readable storage medium 524 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine readable storage medium" shall accordingly be taken to include, but not be limited to, solid-state memories, and optical and magnetic media.

Various operations or functions are described herein, which may be described or defined as software code, instructions, configuration, and/or data. The content may be directly executable ("object" or "executable" form), source code, or difference code ("delta" or "patch" code). The software content of the embodiments described herein may be provided via an article of manufacture with the content stored thereon, or via a method of operating a communication interface to send data via the communication interface. A machine or computer readable storage medium may cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein may be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications may be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A computer-implemented method comprising:
    identifying a string of characters in a stream of input characters;
    determining an age indicator that indicates a time the string of characters was identified relative to an initial time;
    copying the age indicator into an age field of an entry for the string of characters in a string translation table;
    adjusting a use count that indicates a number of time the string of characters has been encountered in the stream; and
    determining whether to remove the entry from the table based on the age indicator and the use count.

2. The method of claim 1, wherein identifying the string of characters comprises:
    identifying the string of characters as part of an implementation based on LZW (Lempel-Ziv-Welch) compression algorithm.

3. The method of claim 1, wherein determining the age indicator comprises:
    calculating a byte offset of the string of characters, the byte offset being an offset from a starting point of the stream.

4. The method of claim 1, and wherein copying the age indicator comprises:
    copying the determined age indicator as an additional age indicator to be stored in the entry.

5. The method of claim 1, wherein the entry exists and has a previous age indicator, and wherein copying the age indicator further comprises:
    replacing the previous age indicator with the determined age indicator of the identified string of characters.

6. The method of claim 1, wherein adjusting the counter comprises:
    initializing the counter to an initial value.

7. The method of claim 1, wherein the entry includes a creation age indicator and a use age indicator, and wherein determining whether to remove the entry based on the age indicator and the use count further comprises:
computing a product of the use age indicator and the use count;
adding the computed product to the creation age indicator; and
removing the entry if the sum is lower than that of another entry.

8. The method of claim 1, wherein determining whether to remove the entry comprises:
determining whether to remove a single entry to make room in the string translation table for a new entry.

9. The method of claim 1, wherein determining whether to remove the entry comprises:
determining whether to remove the entry as part of removing a portion of the string translation table in response to the string translation table being full, instead of removing the entire string translation table.

10. The method of claim 1, further comprising:
sorting the string translation table based on the age indicator and the use count.

11. A computer-readable storage medium having instructions stored thereon to cause a processor to perform operations including:
identifying a string of characters in a stream of input characters;
determining an age indicator that indicates a time the string of characters was identified relative to an initial time;
copying the age indicator into an age field of an entry for the string of characters in a string translation table;
adjusting a use count that indicates a number of time the string of characters has been encountered in the stream; and
determining whether to remove the entry from the table based on the age indicator and the use count.

12. The computer-readable medium of claim 11, wherein the instructions for copying the age indicator further comprise instructions for
copying the determined age indicator as an additional age indicator to be stored in the entry.

13. The computer-readable medium of claim 11, wherein entry exists and has a previous age indicator, and wherein the instructions for copying the age indicator further comprise instructions for
replacing the previous age indicator with the determined age indicator of the identified string of characters.

14. The computer-readable medium of claim 11, wherein the entry includes a creation age indicator and a use age indicator, and wherein the instructions for determining whether to remove the entry based on the age indicator and the use count further comprise instructions for
computing a product of the use age indicator and the use count;
adding the computed product to the creation age indicator; and
removing the entry if the sum is lower than that of another entry.

15. The computer-readable medium of claim 11, wherein the instructions for determining whether to remove the entry comprise instructions for
determining whether to remove the entry as part of removing a portion of the string translation table in response to the string translation table being full, instead of removing the entire string translation table.

16. The computer-readable medium of claim 11, further comprising instructions for
sorting the string translation table based on the age indicator and the use count.

17. A computing device comprising:
a data storage device to store a string translation table, the string translation table to store entries each having a string and a corresponding index for use in compression, the string translation table having a maximum number of entries; and
a table manager to manage the string translation table, the table manager to:
identify a string of characters in a stream of input characters;
determine an age indicator that indicates a time the string of characters was identified relative to an initial time;
copy the age indicator into an age field of an entry for the string of characters in a string translation table;
adjust a use count that indicates a number of time the string of characters has been encountered in the stream; and
determine whether to remove the entry from the table based on the age indicator and the use count.

18. The computing device of claim 17, wherein the table manager further comprises:
an insertion manager to create the age field and a use count field for a new entry, where adjusting the use count includes initializing the use count to an initial value; and
an entry updater to update the age field and the use count fields for identified strings that already have corresponding entries in the string translation table, the entry updater to replace a previous age indicator with the determined age indicator, and the entry updater to increment the use count.

19. The computing device of claim 17, where the table manager further comprises:
a table sorter to maintain a sorted list of the entries in the string translation table, the sorted list in order of a relative importance of each string as compared to the other strings in the string translation table, where the relative importance is computed based on the age indicator and the use count.

* * * * *